United States Patent
Larkin et al.

(10) Patent No.: US 8,273,623 B2
(45) Date of Patent: Sep. 25, 2012

(54) INTEGRATED HIGH VOLTAGE CAPACITOR HAVING CAPACITANCE UNIFORMITY STRUCTURES AND A METHOD OF MANUFACTURE THEREFOR

(75) Inventors: David L. Larkin, Richardson, TX (US);
Lily X. Springer, Dallas, TX (US);
Makoto Takemura, Dallas, TX (US);
Ashish V. Gokhale, Allen, TX (US);
Dhaval A. Saraiya, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/396,159

(22) Filed: Feb. 14, 2012

(65) Prior Publication Data

US 2012/0142164 A1   Jun. 7, 2012

Related U.S. Application Data (62) Division of application No. 12/276,507, filed on Nov. 24, 2008, now Pat. No. 8,114,731, which is a division of application No. 11/250,047, filed on Oct. 13, 2005, now Pat. No. 7,470,991.

(60) Provisional application No. 60/655,959, filed on Feb. 24, 2005.

(51) Int. Cl.
*H01L 21/8242* (2006.01)

(52) U.S. Cl. .. 438/239; 438/250; 438/394; 257/E21.008

(58) Field of Classification Search .................. 438/239, 438/250, 394; 257/E21.008
See application file for complete search history.

(56) References Cited

U.S. PATENT DOCUMENTS 4,805,071 A * 2/1989 Hutter et al. .................. 257/296

* cited by examiner

*Primary Examiner* — Jack Chen
(74) *Attorney, Agent, or Firm* — Warren L. Franz; Wade J. Brady, III; Frederick J. Telecky, Jr.

(57) ABSTRACT

The present invention provides an integrated high voltage capacitor, a method of manufacture therefore, and an integrated circuit chip including the same. The integrated high voltage capacitor, among other features, includes a first capacitor plate (120) located over or in a semiconductor substrate (105), and an insulator (130) located over the first capacitor plate (120), at least a portion of the insulator (130) comprising an interlevel dielectric layer (135, 138, 143, or 148). The integrated high voltage capacitor further includes capacitance uniformity structures (910) located at least partially within the insulator (130) and a second capacitor plate (160) located over the insulator (130).

14 Claims, 11 Drawing Sheets

INTEGRATED HIGH VOLTAGE CAPACITOR HAVING CAPACITANCE UNIFORMITY STRUCTURES AND A METHOD OF MANUFACTURE THEREFOR

This application is a division of application Ser. No. 12/276,507 filed Nov. 24, 2008 (now U.S. Pat. No. 8,114,731), which is a division of application Ser. No. 11/250,047 filed Oct. 13, 2005 (now U.S. Pat. No. 7,470,991), which claims the benefit of provisional Application No. 60/655,959 filed Feb. 24, 2005, the entireties of all of which are hereby incorporated by reference.

TECHNICAL FIELD OF THE INVENTION

The present invention is directed, in general, to a high voltage capacitor and, more specifically, to an integrated high voltage capacitor and a method of manufacture therefor.

BACKGROUND OF THE INVENTION

Modern day electronic equipment often requires galvanic isolation between the high voltage side and control signal side of the electronic equipment. Galvanic isolation means that no electrical current can flow directly between the high voltage side and the control signal side, as there is no direct electrical contact. However, even though the high voltage side and control signal side are galvanically isolated from one another, a signal can flow between the two.

One piece of electronic equipment, among many, that might require the aforementioned galvanic isolation is an x-ray machine. Typically, very high voltages are required to operate an x-ray machine. However, these very high voltages need to be shielded from the patient and/or operator of the x-ray machine. Another piece of electronic equipment that might require the aforementioned galvanic isolation is a motor controller. For example, galvanic isolation could be used to electrically separate the 220 volt motor windings from the control module controlling the motor windings.

In each of the uses of galvanic isolation, the galvanic isolation solution needs to be fast, compact, capable of integration into the preexisting systems, and immune to electromagnetic noise. Moreover, many of the solutions must receive certification from the Association for Electrical, Electronic & Information Technologies (VDE), Underwriters Laboratories (UL), CSA International (CSA), International Organization for Standardization (ISO), etc. These certifications often require robust solutions (e.g., reliable for an extended period of time) capable of withstanding extremely high DC voltages, as well as RMS voltages. These certifications also require for the solutions to have a relatively high transient immunity (e.g., the ability to handle voltage spikes).

Given the aforementioned desires for galvanic isolation, as well as the requirements thereof, the electronics industry has focused on a number of different solutions. One such solution is the placement of a discrete high voltage capacitor (or pairs of capacitors) between the high voltage side and control signal side of the electronics equipment. These discrete high voltage capacitors are generally located on a separate substrate positioned proximate the substrate that the control signal circuitry is located on, and connected to the control signal side using wire bonds.

Unfortunately, the galvanic isolation provided using these discrete high voltage capacitors is often insufficient for today's electronics equipment. For instance, because it is difficult to manufacture these discrete high voltage capacitors having matched capacitance values (e.g., within less than about 2 percent), the capacitors have inadequate transient immunity values. The discrete high voltage capacitors fail in other areas also.

Accordingly, what is needed in the art is a high voltage capacitor, and a method of manufacture therefore, that does not experience the drawbacks of the prior art discrete high voltage capacitors.

SUMMARY OF THE INVENTION

To address the above-discussed deficiencies of the prior art, the present invention provides an integrated high voltage capacitor, a method of manufacture therefore, and an integrated circuit chip including the same. The integrated high voltage capacitor, among other features, includes a first capacitor plate located over or in a semiconductor substrate, and an insulator located over the first capacitor plate, at least a portion of the insulator comprising an interlevel dielectric layer. The integrated high voltage capacitor further includes capacitance uniformity structures located at least partially within the insulator and a second capacitor plate located over the insulator.

The present invention provides, in another embodiment, a method for manufacturing an integrated high voltage capacitor. The method for manufacturing the integrated high voltage capacitor, without limitation, includes forming the first capacitor plate, insulator, and second capacitor plate detailed in the paragraph above.

As has been briefly mentioned, another embodiment of the present invention is an integrated circuit chip. The integrated circuit chip may include one or more transistors located over or in a semiconductor substrate, the one or more transistor having one or more interlevel dielectric layers located thereover, and a high voltage capacitor including a first capacitor plate, an insulator and a second capacitor plate located at least partially in or over the semiconductor substrate, wherein at least one of the one or more interlevel dielectric layers forms at least a portion of the insulator, and further wherein capacitance uniformity structures are located at least partially within the insulator.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying figures. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention is based, at least in part, on the unique recognition that high voltage capacitors may be integrated with standard transistors over or in a single substrate. Heretofore the present invention, the industry thought it impossible to achieve the breakdown voltages required for such high voltage capacitors if the high voltage capacitors were integrated over or in the same substrate as the transistors. The present invention, however, acknowledged that by using one or more of the interlevel dielectric layers traditionally located over the transistors as at least a portion of the insulator of the high voltage capacitors, the required breakdown voltages could be attained while incorporating the high voltage capacitors and transistors together. Accordingly, but for this acknowledgment, as well as other related acknowledgements, the industry would not attempt to integrate the high voltage capacitors and transistors over or in the same substrate.

For the purpose of completeness, various terms used throughout this disclosure should be defined. One such term that needs defining is a high voltage capacitor. Thus, a high voltage capacitor, as used throughout this invention, is a capacitor that may withstand in excess of 200 volts continuously throughout its useful lifetime. Another such term that needs defining is an interlevel dielectric layer. An interlevel dielectric layer, as used herein, is any dielectric layer used to electrically isolate transistor level features from the metal level located directly thereover, or any dielectric layer used to electrically isolate two adjacent metal levels. Accordingly, the dielectric layer used to isolate the transistor level features from the first metal level would be considered an interlevel dielectric layer. Similarly, the dielectric layer used to separate the first metal level from the second metal level, and so on and so forth, would also be considered an interlevel dielectric layer.

Figure 1:
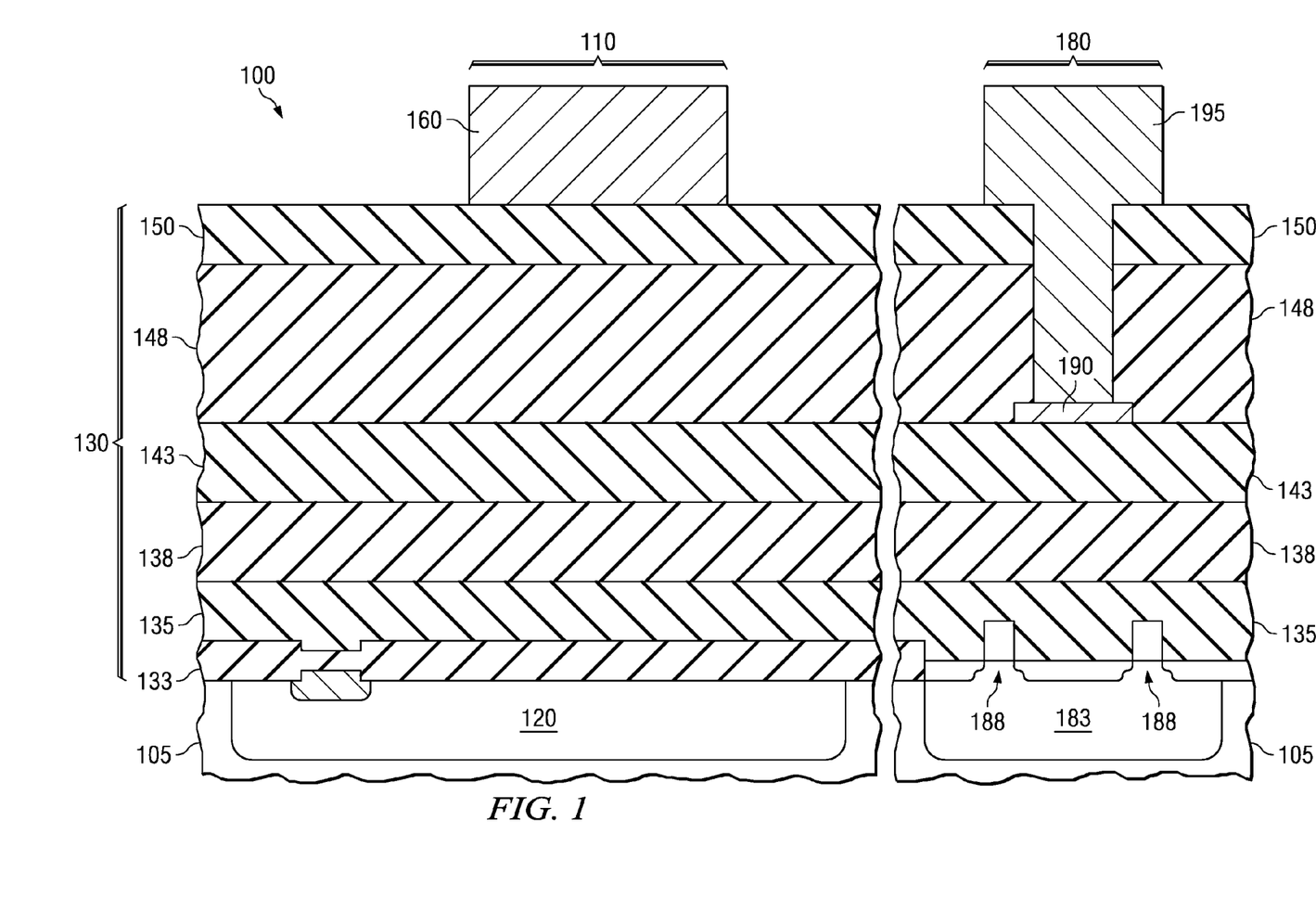
FIG. 1 illustrates a cross-sectional view of one embodiment of an integrated circuit chip manufactured in accordance with the principles of the present invention.

Turning now to FIG. 1, illustrated is a cross-sectional view of one embodiment of an integrated circuit chip 100 manufactured in accordance with the principles of the present invention. The integrated circuit chip 100 includes a high voltage capacitor region 110 and a transistor region 180 integrated over or in the same semiconductor substrate 105. As those skilled in the art appreciate, the high voltage capacitor region 110 includes an insulator disposed between a first capacitor plate and a second capacitor plate. In accordance with the principles of the present invention, at least a portion of the insulator of the high voltage capacitor region 110 includes an interlevel dielectric layer.

In the illustrative embodiment of FIG. 1, the high voltage capacitor region 110 includes an insulator 130 disposed between a first capacitor plate 120 and a second capacitor plate 160. In this embodiment, the first capacitor plate 120 is a doped region in the semiconductor substrate 105. For example, the first capacitor plate 120 in the embodiment of FIG. 1 is a heavily doped n-well region having a peak dopant concentration ranging from about $1E18$ atoms/cm$^3$ to about $1E19$ atoms/cm$^3$. The first capacitor plate 120 further includes a low resistance contact portion located therein. In those instances wherein the first capacitor plate 120 comprises the heavily doped n-well region, the low resistance contact portion comprises a similar type dopant, but has a dopant concentration higher than that of the heavily doped n-well region.

The insulator 130 in the embodiment of FIG. 1 uniquely comprises at least one interlevel dielectric layer. For example, as shown, the insulator 130 of FIG. 1 includes a field oxide region 133, a first interlevel dielectric layer 135, a second interlevel dielectric layer 138, a third interlevel dielectric layer 143, a fourth interlevel dielectric layer 148, and a protective overcoat layer 150. It should be noted that in certain instances the upper most interlevel dielectric layer (in this instance the fourth interlevel dielectric layer 148) and the protective overcoat layer 150 will collectively be referred to as the protective overcoat layer. Such a reference scheme should not be used to alter the scope of the present invention. Accordingly, the insulator 130 in the embodiment of FIG. 1 comprises the various dielectric layers located between the first capacitor plate 120 and the second capacitor plate 160.

It should be noted that the thicknesses of the different layers comprising the insulator 130 might be modified to provide varying capacitance values. For example, in the exemplary embodiment shown in FIG. 1 the thickness of the fourth interlevel dielectric layer 148 was nearly doubled, at least as compared to the other interlevel dielectric layers 135, 138, 143, to provide the requisite capacitance values. Similarly, additional interlevel dielectric layers could also be added or removed to affect the desired capacitance values.

The second capacitor plate 160 in the embodiment of FIG. 1 comprises a conductive feature located over the protective overcoat layer 150. More specifically, the second capacitor plate 160, in the embodiment shown, comprises a copper conductive feature. As those skilled in the art will appreciate, the use of the copper conductive feature as the second capacitor plate 160 integrates well into the traditional back-end transistor process flow.

The high voltage capacitor region 110 illustrated in FIG. 1 might be similar to that required in certain extremely high voltage scenarios. Particularly, the high voltage capacitor region 110 illustrated in FIG. 1 might be used to accommodate voltages including and in excess of about 3000 volts peak.

The transistor region 180 in the embodiment of FIG. 1 includes one or more transistors 188 that are located in or over a well region 183. The well region 183, similar to the first capacitor plate 120, comprises a highly doped n-type well region. As will be further discussed below, the first capacitor plate 120 and the well region 183 may be advantageously formed in the same processing step, at least in those embodiment wherein the first capacitor plate 120 comprises the highly doped n-type well region. The one or more transistors 188, as those skilled in the art appreciate, include gate dielectrics, gate electrodes, source/drain regions, etc. While the one or more transistors 188 illustrated in FIG. 1 are metal oxide semiconductor (MOS) transistors, other embodiments of the present invention exist wherein the one or more transistors 188 are bipolar transistors, or a combination of MOS and bipolar transistors.

Located over the one or more transistors 188 are the first, second, third and fourth interlevel dielectric layers 135, 138, 143, 148. Additionally located over the one or more transistors is an upper conductive lead 190. The upper conductive lead 190 in the embodiment of FIG. 1 is located between the third interlevel dielectric layer 143 and the fourth interlevel dielectric layer 148. However, other embodiments exist wherein the upper conductive lead 190 is located elsewhere.

Contacting the upper conductive lead 190, and providing electrical contact to the one or more transistors 188 may be a conductive feature 195. The conductive feature 195 may be advantageously formed in the same processing step as the second capacitor plate 160, thus in the embodiment of FIG. 1 the second conductive feature 195 may also comprise copper.

The high voltage capacitor of FIG. 1 provides a number of benefits over traditional discrete high voltage capacitors. First, as the high voltage capacitor is integrated with the transistors in or over the same substrate, many of the processing steps used to manufacture the transistors may also be used to simultaneously form the integrated high voltage capacitor. In one exemplary embodiment, no additional processing steps (i.e., other than those steps previously required) are needed to manufacture the high voltage capacitor. This alone, amounts to a tremendous saving of both time and expense. Integrating the high voltage capacitor into an integrated circuit chip with transistors further provides a significant space savings.

Apart from the time, expense and space savings discussed directly above, the integrated high voltage capacitor also provides improved reliability and transient immunity. The improved reliability comes from the high quality of the insulator. Additionally, the improved transient immunity comes at least in part, from the ability to precisely match the different integrated high voltage capacitors that might be used together. For example, because the integrated high voltage capacitors are formed using a highly tuned process flow (e.g., that used for years to manufacture integrated circuits), the various different integrated high voltage capacitors may be precisely matched. In one advantageous embodiment, the various different integrated high voltage capacitors have capacitance values that differ by about two-percent or less. In another exemplary embodiment, the capacitance values differ by less than about one percent.

Turning now to FIGS. 2-7, illustrated are cross-sectional views illustrating how one skilled in the art might manufacture an integrated circuit chip in accordance with the principles of the present invention. While FIGS. 2-7 are specifically directed to the manufacture of an integrated circuit chip, FIGS. 2-7 also illustrate, in a broad sense, how one skilled in the art might manufacture a integrated high voltage capacitor in accordance with the principles of the present invention. Thus, a method for manufacturing an integrated high voltage capacitor is discussed within the confines of discussing how one skilled in the art might manufacture an integrated circuit chip with respect to FIGS. 2-7. Nevertheless, while each of these ideas is discussed and illustrated using a single set of FIGS., neither should be limiting on the other.

Figure 2:
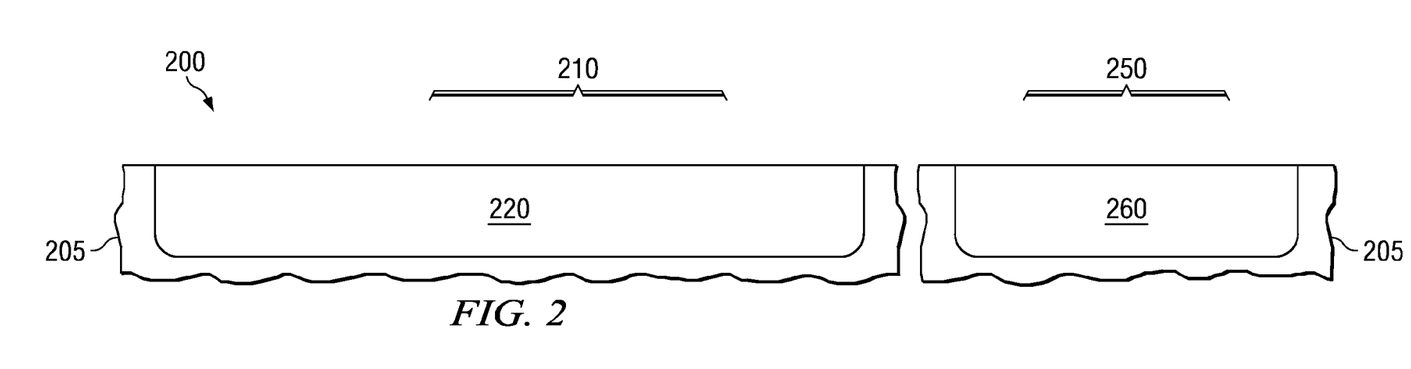
FIG. 2 illustrates a cross-sectional view of an integrated circuit chip at an initial stage of formation.

FIG. 2 illustrates a cross-sectional view of an integrated circuit chip 200 at an initial stage of formation. The integrated circuit chip 200 illustrated in FIG. 2 initially includes a semiconductor substrate 205. The semiconductor substrate 205 illustrated in FIG. 2 may, in an exemplary embodiment, be any layer located in the partially completed integrated circuit chip 200, including a wafer itself or a layer located above the wafer (e.g., epitaxial layer). In the illustrative embodiment shown, however, the semiconductor substrate 205 comprises an epitaxial silicon layer.

Located in/on/over the semiconductor substrate 205 are two device regions, including a high voltage capacitor region 210 and a transistor region 250. Positioned in the substrate 205 in the high voltage capacitor region 210 is a doped region 220. The doped region 220, in an exemplary embodiment, is a heavily doped n-type well region. For example, the heavily doped n-type well region might have a peak dopant concentration ranging from about 1E16 atoms/cm$^3$ to about 1E20 atoms/cm$^3$. Other embodiments could also exist wherein the doped region 220 is a heavily doped p-type well region. As will be understood more fully below, the doped region 220 will ultimately form a first capacitor plate of the high voltage capacitor region 210

Positioned in the substrate 205 in the transistor region 250 is another doped region 260. The doped region 260, similar to the doped region 220, may comprise a heavily doped n-type well region. In one exemplary embodiment of the present invention, the doped region 260 and the doped region 220 are formed using a photoresist mask in a series of shared processing steps. Accordingly, in this embodiment the doped region 260 might also have a having a peak dopant concentration ranging from about 1E16 atoms/cm$^3$ to about 1E20 atoms/cm$^3$.

Figure 3:
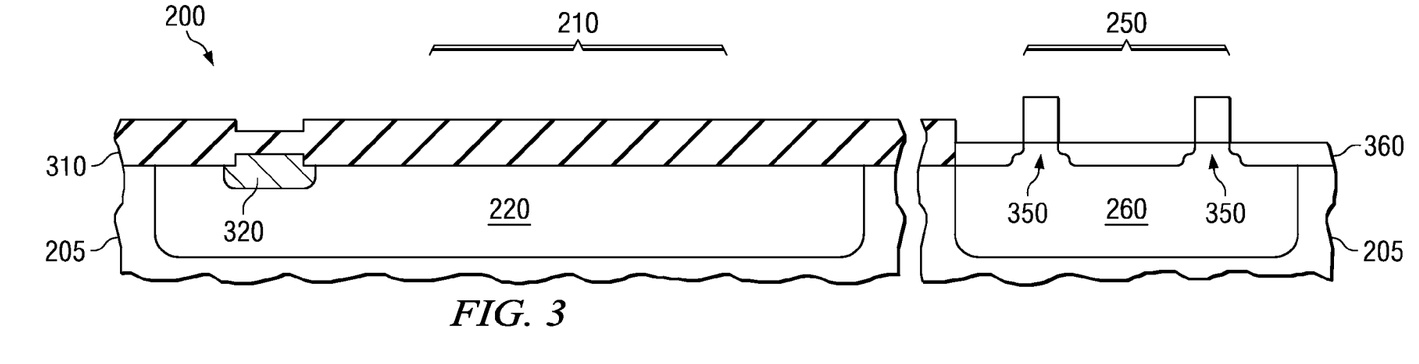
FIG. 3 illustrates a cross-sectional view of the partially completed integrated circuit chip illustrated in FIG. 2 after forming various features in and over the high voltage capacitor region and the transistor region of the substrate.

Turning now to FIG. 3, illustrated is a cross-sectional view of the partially completed integrated circuit chip 200 illustrated in FIG. 2 after forming various features in and over the high voltage capacitor region 210 and the transistor region 250 of the substrate 205. Formed over the substrate 205 in at least a portion of the high voltage capacitor region 210 is a field oxide layer 310. The field oxide layer 310 illustrated in FIG. 3 happens to be a LOCOS field oxide layer, however, other embodiments exist wherein other field oxide layers might be used. Those skilled in the art understand the conventional processes that might be used to form the field oxide layer 310.

As is illustrated in FIG. 3, the field oxide layer 310 helps define a low resistance contact portion 320 in the doped region 220. As one would expect, the low resistance contact portion 320 would allow for electrical connection to the doped region 220, and thus the first capacitor plate of the high voltage capacitor region 210. In one embodiment of the present invention, the low resistance contact portion 320 would advantageously have a peak dopant concentration ranging from about 1E14 atoms/cm$^3$ to about 1E15 atoms/cm$^3$, and would be doped with the same type dopant as the doped region 220.

The transistor region 250 includes conventional transistors 350 located over or in the doped region 260. As those skilled in the art appreciate, the one or more conventional transistors include conventionally formed gate dielectrics, gate electrodes, source/drain regions, etc. As those skilled in the art understand the conventional processes that might be used to manufacture the one or more transistors 350 within the transistor region 250, no further detail regarding their manufacture is needed. It should again be noted that the one or more transistors 350 might comprise other types of transistors, for example bipolar transistors in one embodiment, and remain within the purview of the present invention.

Figure 4:
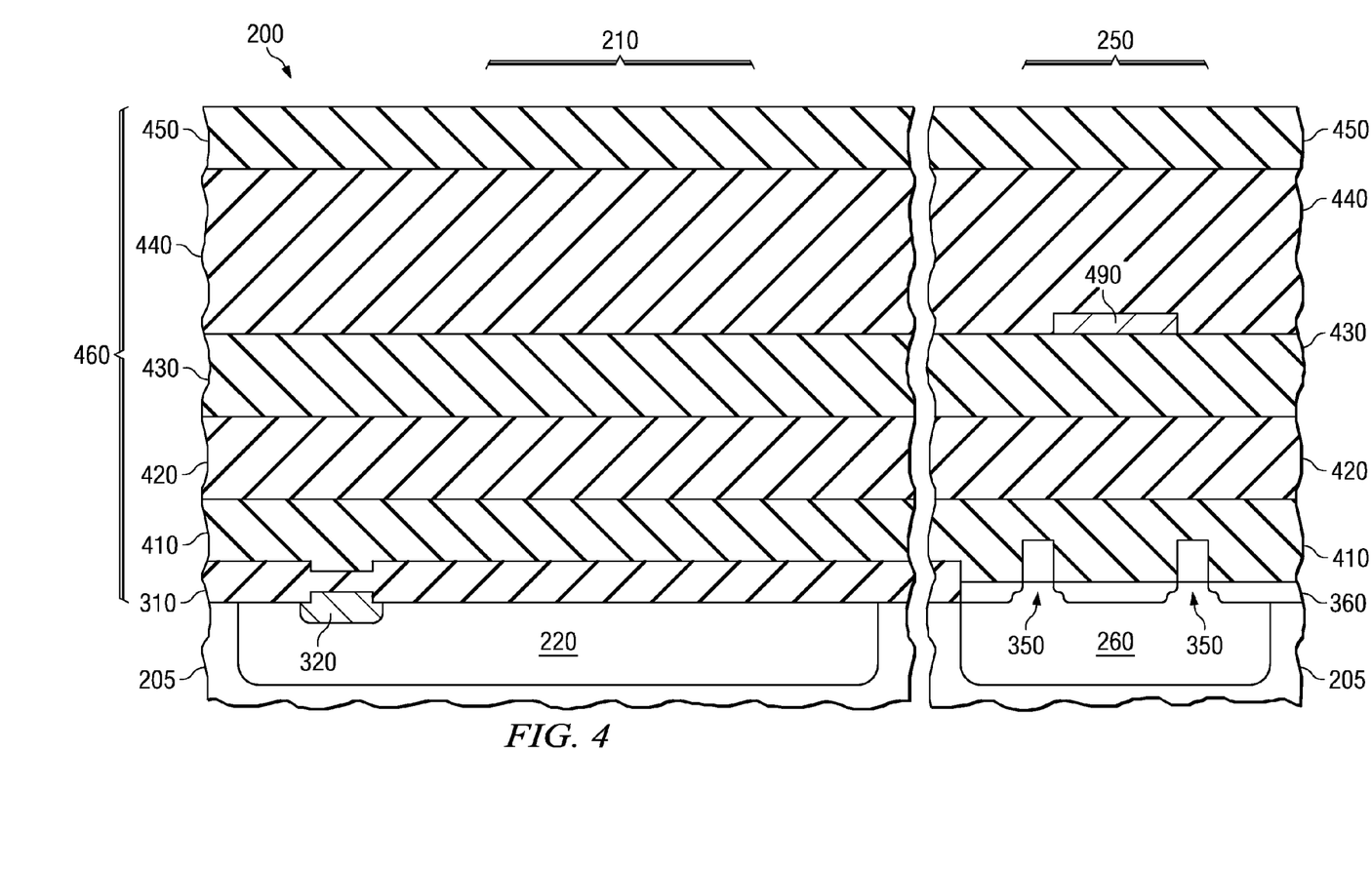
FIG. 4 illustrates a cross-sectional view of the partially completed integrated circuit chip illustrated in FIG. 3 after forming various different insulator layers over the substrate in both the high voltage capacitor region and the transistor region.

Turning now to FIG. 4, illustrated is a cross-sectional view of the partially completed integrated circuit chip 200 illustrated in FIG. 3 after forming various different insulator layers over the substrate 205 in both the high voltage capacitor region 210 and the transistor region 250. As is illustrated in FIG. 4, a first interlevel dielectric layer is formed directly over the field oxide layer 310 and the one or more transistors 350. The first interlevel dielectric layer 410, among others, might comprise a conventionally formed 0.7 μm boro-phosphorous silicate glass (BPSG) layer.

Figure 7:
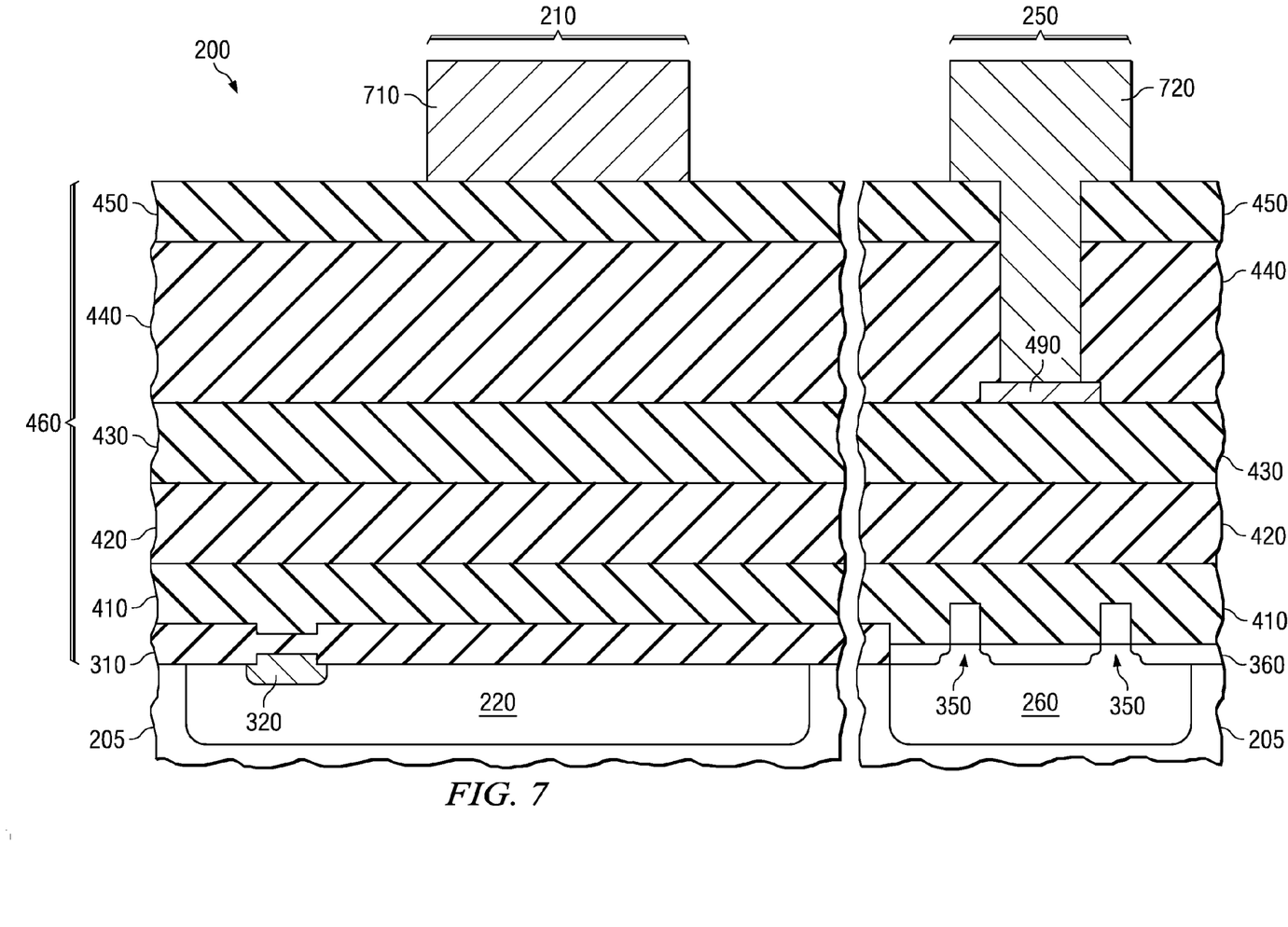
FIG. 7 illustrates a cross-sectional view of the partially completed integrated circuit chip illustrated in FIG. 6 after forming a second capacitor electrode over the protective overcoat layer in the high voltage capacitor region, and forming a conductive feature over and within the opening in the protective overcoat layer in the transistor region.

Formed over the first interlevel dielectric layer 410 is a second interlevel dielectric layer 420. The second interlevel dielectric layer 420, in one embodiment, might comprise a conventionally formed 1.20 μm tetra ethyl ortho silicate (TEOS) layer. Additionally formed over the second interlevel dielectric layer 420 in the embodiment of FIG. 4 is a third interlevel dielectric layer 430 and a fourth interlevel dielectric layer 440. In the embodiment shown, the third interlevel dielectric layer 430 comprises a conventionally formed 1.20 μm TEOS layer and the fourth interlevel dielectric layer 440 comprises a conventionally formed 2.6 μm TEOS layer. The difference in thickness between the third and fourth interlevel dielectric layers 430, 440, is due, in part, to the desire to provide additional insulator thickness between the doped region 220, and thus the first capacitor plate, and the second capacitor plate 710 (FIG. 7).

Conventionally formed over the fourth interlevel dielectric layer 440 is a protective overcoat layer 450. The protective overcoat 450 may have many different thicknesses while staying within the purview of the present invention; however, in the embodiment of FIG. 4 the protective overcoat layer 450 has a thickness ranging from about 1.0 μm to about 2.0 μm.

As is illustrated in FIG. 4, the collection of the field oxide layer 310, first interlevel dielectric layer 410, second interlevel dielectric layer 420, third interlevel dielectric layer 430, fourth interlevel dielectric layer 440 and the protective overcoat layer 450 comprise an insulator 460 of the high voltage capacitor region 210. Were other insulator layers to be located between the doped region 220 and the second capacitor plate 710 (FIG. 7), those insulator layers might also comprise a portion of the insulator 460.

Formed between the third interlevel dielectric layer 430 and the fourth interlevel dielectric layer 440 in the transistor region 250 is an upper conductive lead 490. The upper conductive lead 490, in the embodiment of FIG. 4, comprises aluminum and is configured to provide electrical connection to one or more of the transistors 350 located therebelow. As those skilled in the art understand the process for forming the upper conductive lead 490, including depositing a blanket layer of aluminum on the third interlevel dielectric layer 430 and patterning the blanket layer of metal to form the upper conductive lead 490, no further detail is warranted.

Figure 5:
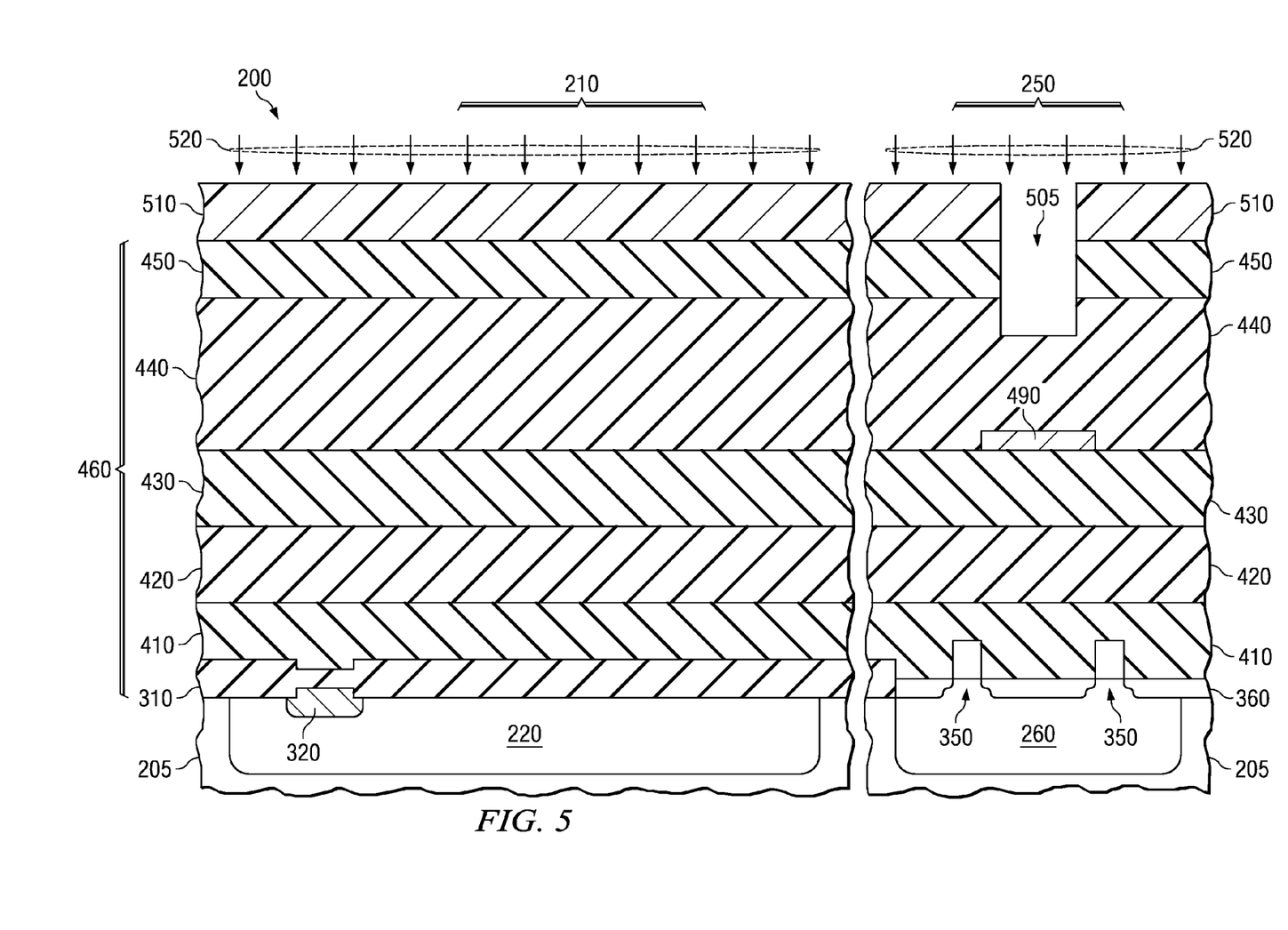
FIG. 5 illustrates a cross-sectional view of the partially completed integrated circuit chip illustrated in FIG. 4 after forming an opening through at least a portion of the protective overcoat layer.

Turning now to FIG. 5, illustrated is a cross-sectional view of the partially completed integrated circuit chip 200 illustrated in FIG. 4 after forming an opening 505 through at least a portion of the protective overcoat layer 450. In the embodiment shown, the opening 505 is formed entirely through the protective overcoat 450 and into the fourth interlevel dielectric layer 440. The first etch 520 should, in an advantageous embodiment, stop before breaking through the fourth interlevel dielectric layer 440. Many different etchants could be used to form the opening 505; however, one embodiment of the present invention advantageously uses a first dry etch.

Figure 6:
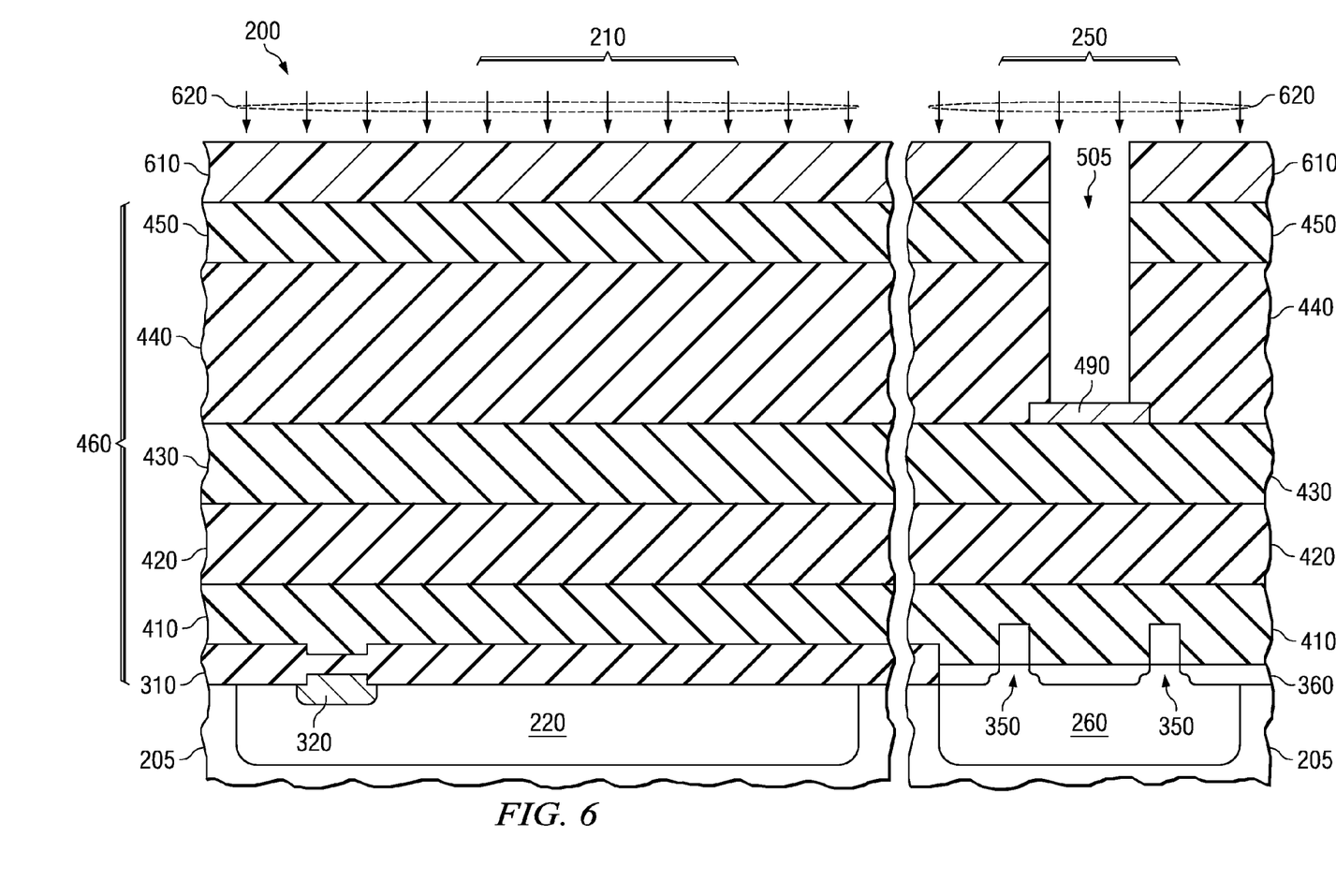
FIG. 6 illustrates a cross-sectional view of the partially completed integrated circuit chip illustrated in FIG. 5 after removing the first patterned photoresist layer, forming a second patterned photoresist layer and completing the opening through the remaining portion of the protective overcoat layer.

Turning now to FIG. 6, illustrated is a cross-sectional view of the partially completed integrated circuit chip 200 illustrated in FIG. 5 after removing the first patterned photoresist layer 510, forming a second patterned photoresist layer 610 and completing the opening 505 through the remaining portion of the fourth interlevel dielectric layer 440. In the embodiment shown, the opening 505 is formed through the fourth interlevel dielectric layer 440 using the second patterned photoresist layer 610 and the second etch 620. The second etch 620 should, as a result of the first etch 520, not have a problem with breaking through the fourth interlevel dielectric layer 440 before contacting the upper conductive lead 490. Again, many different etchants could be used to complete the opening 505; however, one embodiment of the present invention uses a second dry etch.

The double pass photo and etch process described using FIGS. 5 and 6 may be used to accommodate the very deep opening 505 that is needed to clear the protective overcoat layer 450 and the extremely thick fourth interlevel dielectric layer 440, and thereby contact the upper conductive lead 490, without compromising the protective overcoat layer 450. The double pass photo and etch process enables standard photoresists, steppers, and plasma etch tools to achieve a very deep opening 505, while maintaining full passivation integrity. Accordingly, no exotic photoresist films, stepper configurations or etch plasma chemistries are needed to form the opening 505 through the protective overcoat layer 450 and the extremely thick fourth interlevel dielectric layer 440.

Turning now to FIG. 7, illustrated is a cross-sectional view of the partially completed integrated circuit chip 200 illustrated in FIG. 6 after forming a second capacitor electrode 710 over the protective overcoat layer 450 in the high voltage capacitor region 210, and forming a conductive feature 720 over and within the opening 505 in the protective overcoat layer 450 in the transistor region 250. In the embodiment shown, both the second capacitor electrode 710 and the conductive feature 720 comprise a relatively thick layer of copper. For instance, in one exemplary embodiment of the present invention, both the second capacitor electrode 710 and the conductive feature 720 have a thickness ranging from about 9 μm to about 15 μm above the protective overcoat 450. Other thicknesses are, however, within the broad purview of the present invention.

In one embodiment, the second capacitor electrode 710 and the conductive feature 720 are formed using a copper electroplating process, whereby a thick layer of copper is formed over the entire top surface of the protective overcoat 450, including within the opening 505. Thereafter, the thick layer of copper may be patterned, resulting in the second capacitor electrode 710 and the conductive feature 720. Nevertheless, other different embodiments exist. What results after forming the second capacitor electrode 710 and the conductive feature 720 is a device substantially similar to the integrated circuit chip 100 illustrated and described with respect to FIG. 1.

Figure 8:
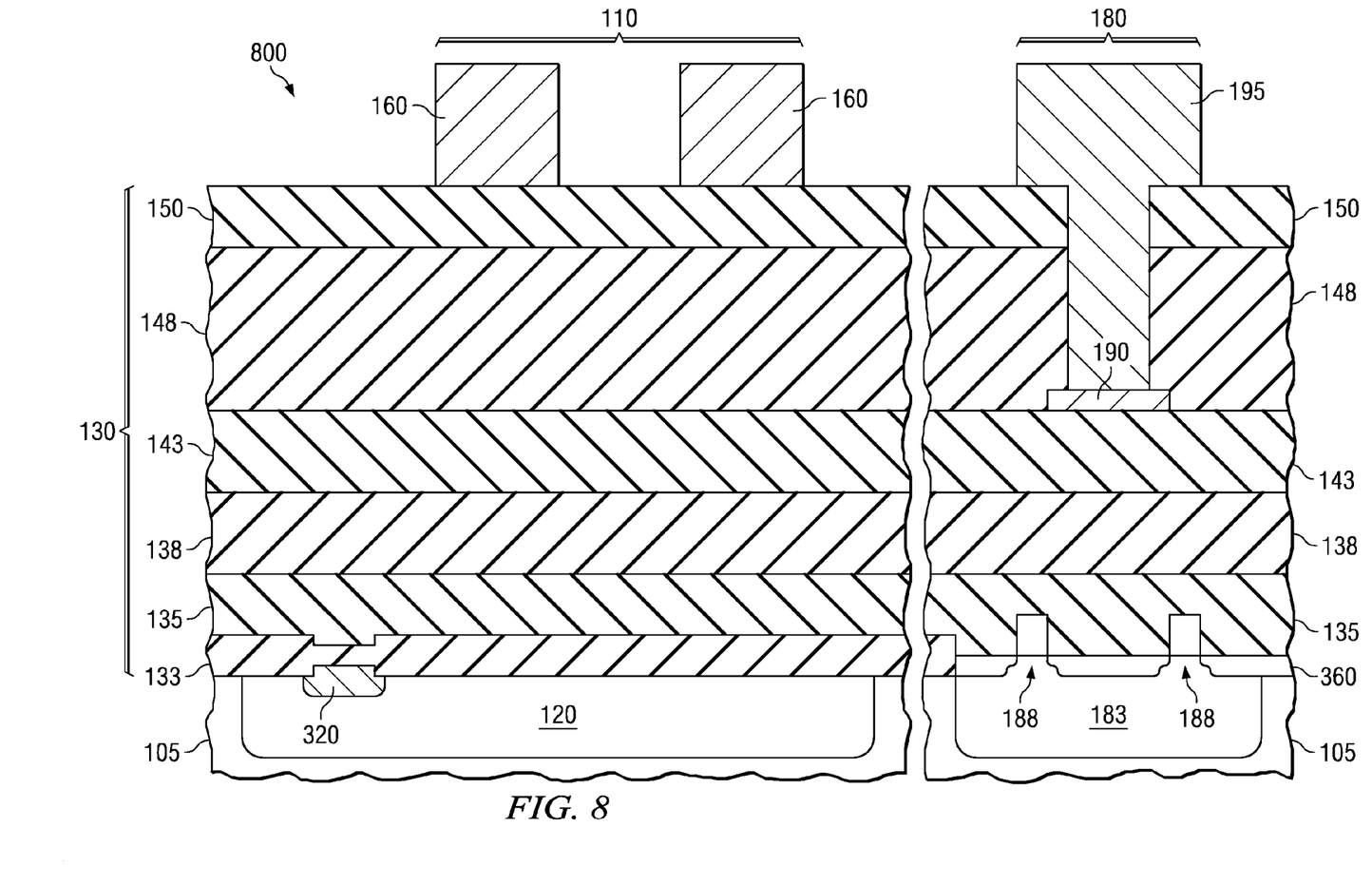
FIG. 8 illustrates a cross-sectional view of another embodiment of an integrated circuit chip manufactured in accordance with the principles of the present invention.

Turning now briefly to FIG. 8, illustrated is a cross-sectional view of another embodiment of an integrated circuit chip 800 manufactured in accordance with the principles of the present invention. The integrated circuit chip 800 illustrated in FIG. 8 is substantially similar to the integrated circuit chip 100 illustrated in FIG. 1, with the exception that the high voltage device region 110 of the integrated circuit chip 800 of FIG. 8 includes more than one high voltage capacitor. As denoted by the like reference numbers used in FIGS. 1 and 8, the other features are substantially similar. This embodiment is used to illustrate that multiple high voltage capacitors may be included within the same integrated circuit chip.

Figure 9:
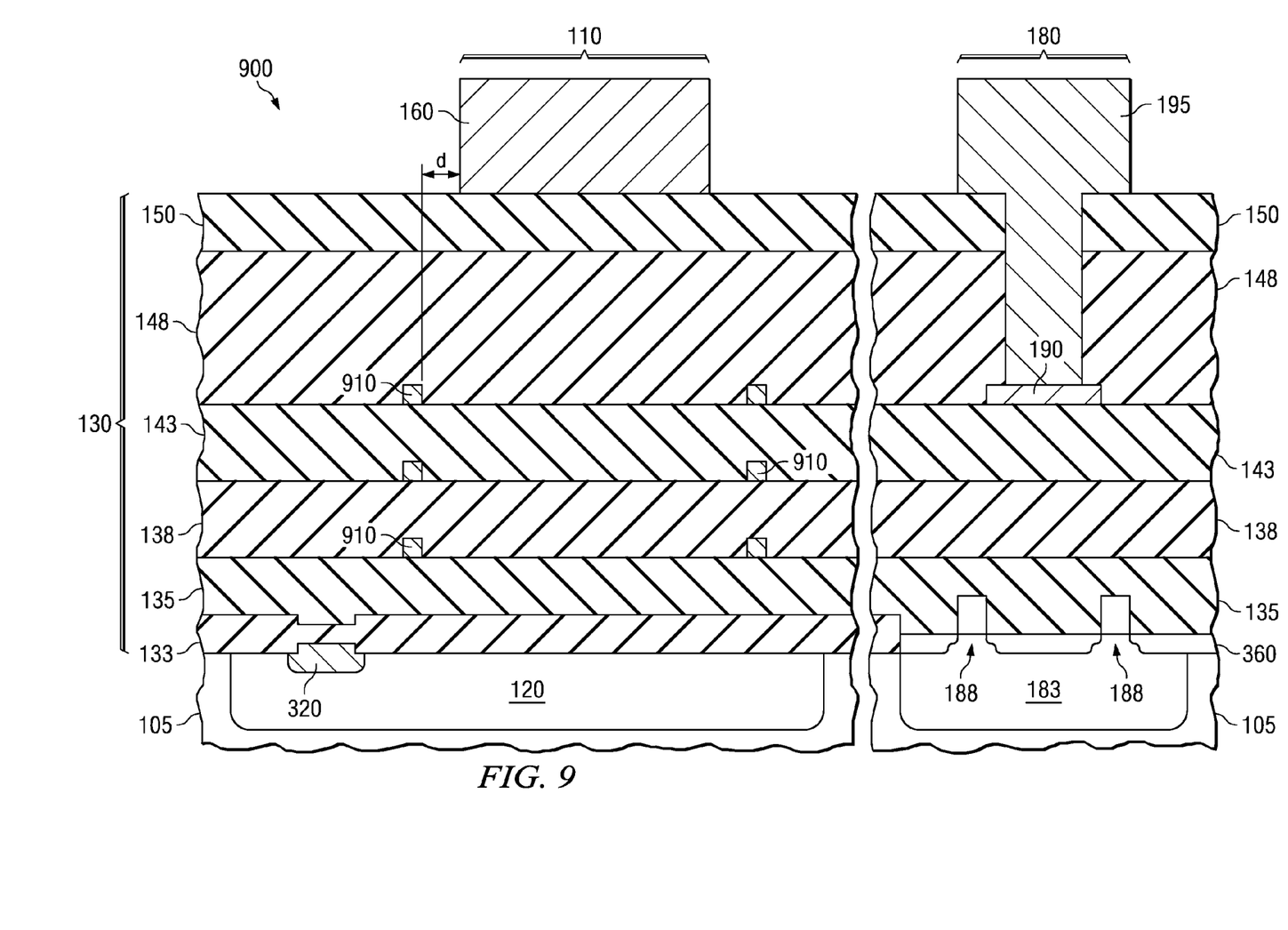
FIG. 9 illustrates a cross-sectional view of an alternative embodiment of an integrated circuit chip manufactured in accordance with the principles of the present invention.

Turning now to FIG. 9, illustrated is a cross-sectional view of an alternative embodiment of an integrated circuit chip 900 manufactured in accordance with the principles of the present invention. The integrated circuit chip 900 illustrated in FIG. 9 is substantially similar to the integrated circuit chip 100 illustrated in FIG. 1, with the exception that the integrated circuit chip 900 includes capacitance uniformity structures 910 within one or more of the interlevel dielectric layers 135, 138, 143, and 148. Because the integrated circuit chip 900 is substantially similar to the integrated circuit chip 100, like reference numbers are used to reference like features.

The capacitance uniformity structures 910 illustrated in FIG. 9 are configured to normalize the topology of the insulator 130 of the high voltage capacitor 110. More specifically, the capacitance uniformity structures 910 are configured to provide more precise across wafer uniformity in the insulator layer 130. Because of the improved across wafer uniformity in the insulator layer 130, adjacent high voltage capacitors (such as those illustrated in FIG. 8) may have better matched capacitance values. In one advantageous embodiment, adjacent capacitors are matched by two-percent or less. In another exemplary embodiment, adjacent capacitors are matched by less than about one-percent.

The capacitance uniformity structures 910 may comprise a variety of different structures and remain within the purview of the present invention. In the illustrative embodiment of FIG. 9, however, the capacitance uniformity structures 910 are floating metal rings. The floating metal rings are located between the first interlevel dielectric layer 135 and the second interlevel dielectric layer 138, between the second interlevel dielectric layer 138 and the third interlevel dielectric layer 143, and between the third interlevel dielectric layer 143 and the fourth interlevel dielectric layer 148. The floating metal rings may be formed at the same time as the first metal layer between the first interlevel dielectric layer 135 and the second interlevel dielectric layer 138, the second metal layer between the second interlevel dielectric layer 138 and the third interlevel dielectric layer 143, and the third metal layer between the third interlevel dielectric layer 143 and the fourth interlevel dielectric layer 148. As the capacitance uniformity structures are floating, they are electrically coupled to nothing in the integrated circuit chip 900.

In an exemplary embodiment, the capacitance uniformity structures 910 are located outside of a footprint of the second capacitor plate 160 by a distance (d). The distance (d) ideally is greater than zero. For instance, in one exemplary embodiment the distance (d) is ranges from about 15 µm to about 45 µm. Nevertheless, other distances (d) may be used and remain within the scope of the present invention.

Figure 10:
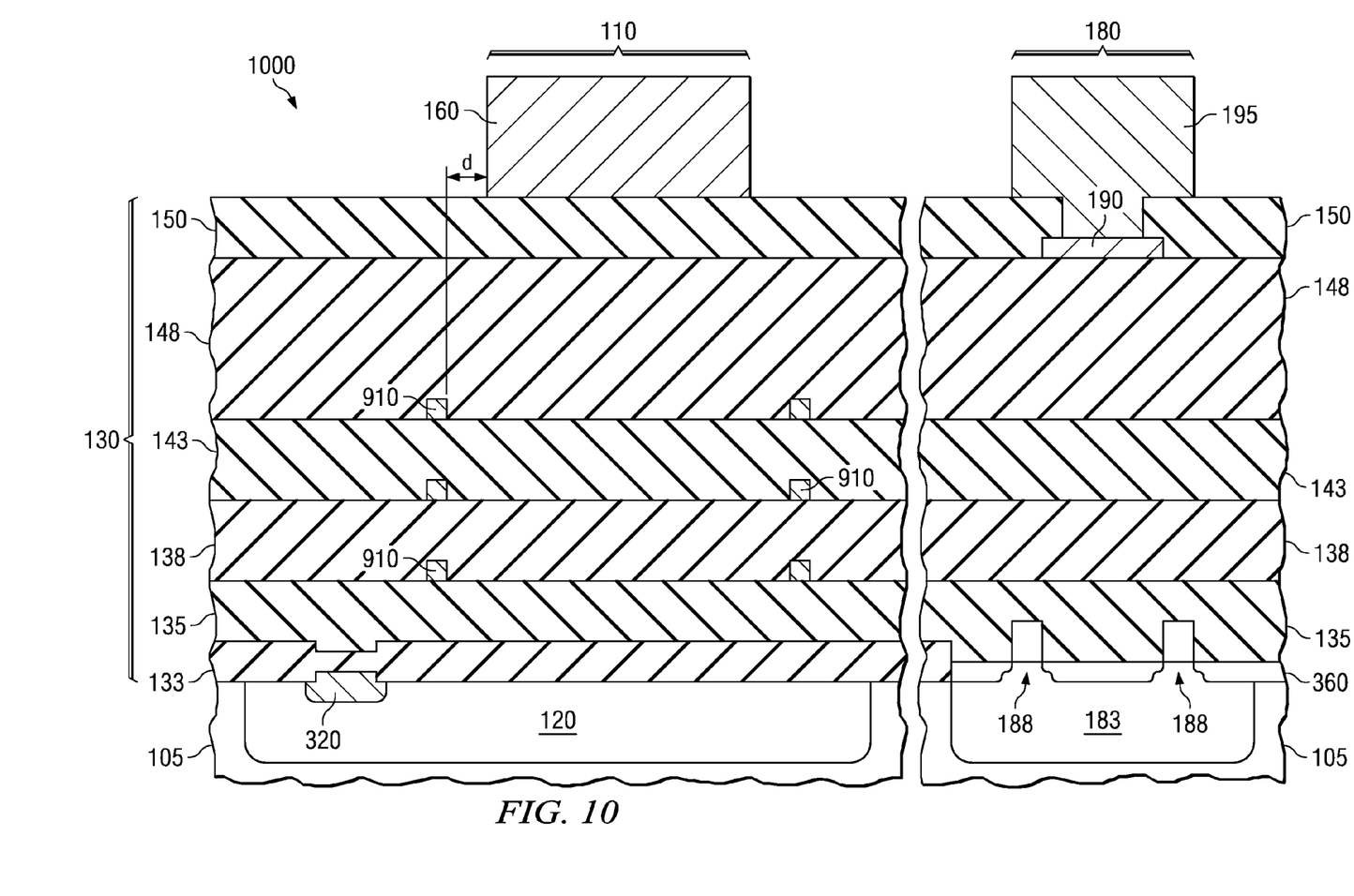
FIG. 10 illustrates a cross-sectional view of an alternative embodiment of an integrated circuit chip manufactured in accordance with the principles of the present invention.

Turning now to FIG. 10, illustrated is a cross-sectional view of an alternative embodiment of an integrated circuit chip 1000 manufactured in accordance with the principles of the present invention. The integrated circuit chip 1000 illustrated in FIG. 10 is substantially similar to the integrated circuit chip 900 illustrated in FIG. 9, with the exception that the integrated circuit chip 1000 has its upper conductive feature 190 formed over the fourth interlevel dielectric layer 148, as compared to over the third interlevel dielectric layer 143 as in FIG. 9.

Figure 11:
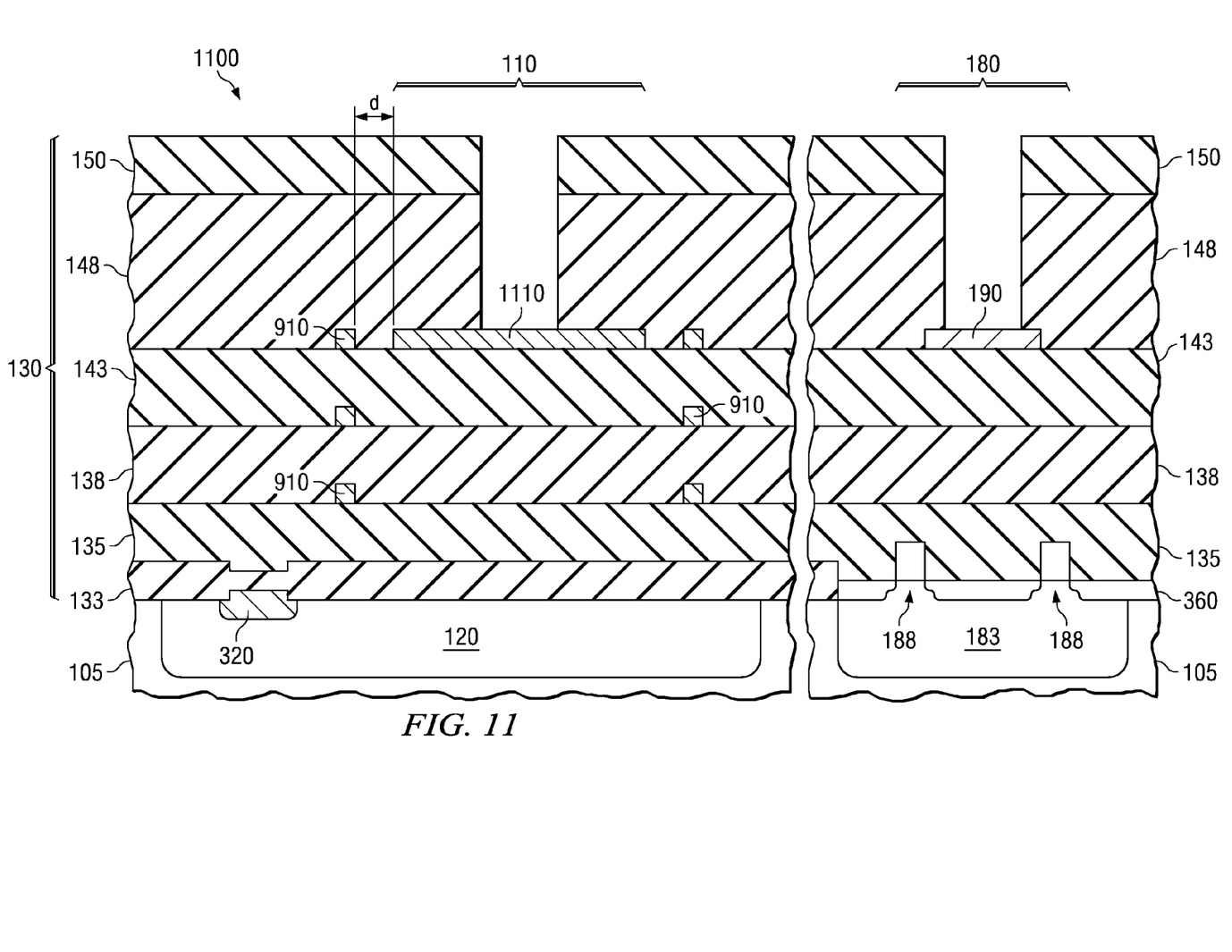
FIG. 11 illustrates a cross-sectional view of an alternative embodiment of an integrated circuit chip manufactured in accordance with the principles of the present invention.

Turning now to FIG. 11, illustrated is a cross-sectional view of an alternative embodiment of an integrated circuit chip 1100 manufactured in accordance with the principles of the present invention. The integrated circuit chip 1100 illustrated in FIG. 11 is substantially similar to the integrated circuit chip 900 illustrated in FIG. 9, with the exception that the integrated circuit chip 1100 uses a third level metal feature 1110 as its second capacitor plate, as compared to the conductive feature 160. Similarly, the conductive feature 195 has been removed, leaving openings in the protective overcoat layer 150 to wire bond directly to the third level metal feature 1110 and the upper conductive lead 190.

Figure 12:
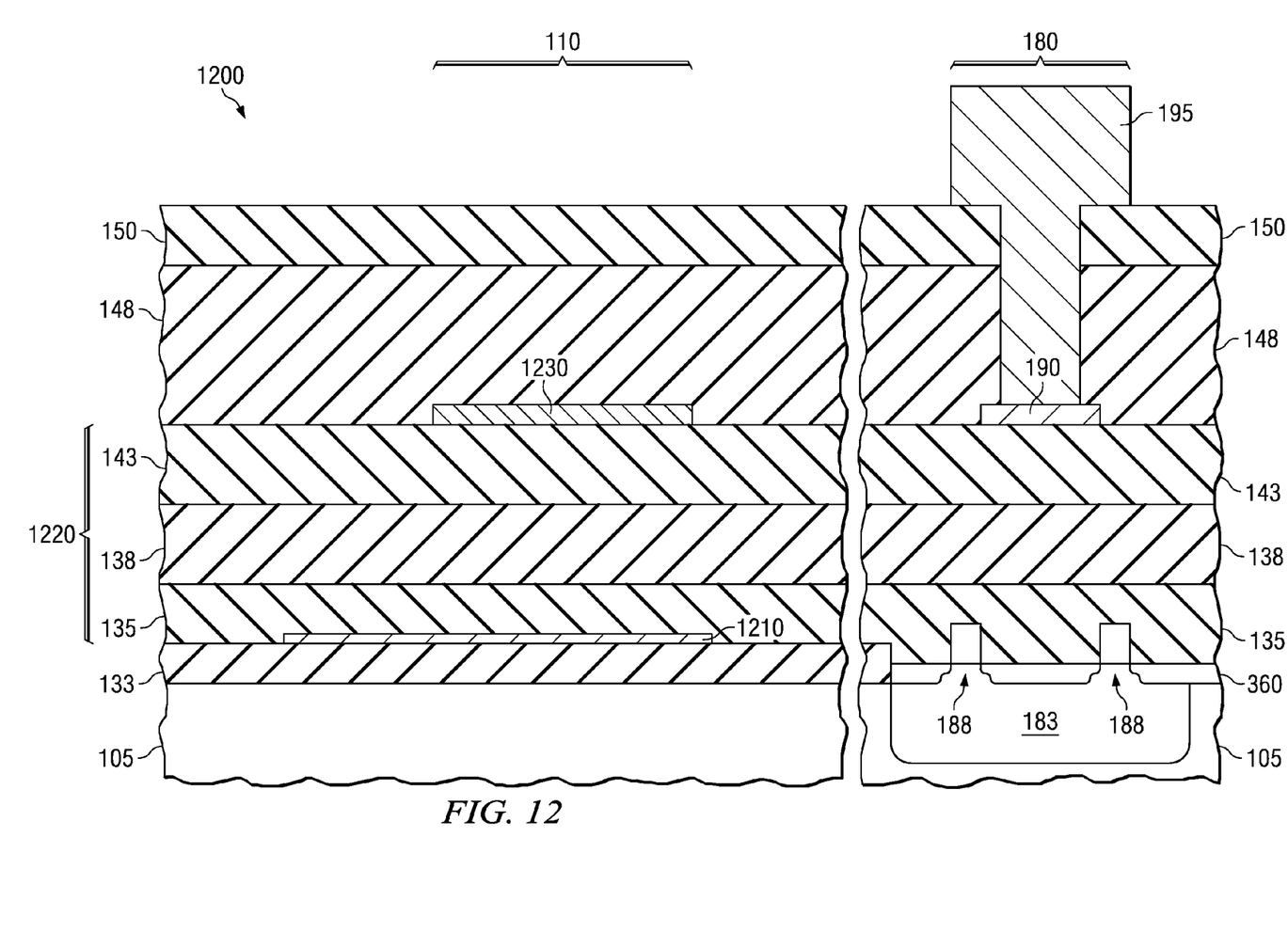
FIG. 12 illustrates a cross-sectional view of an alternative embodiment of an integrated circuit chip manufactured in accordance with the principles of the present invention.

Turning now to FIG. 12, illustrated is a cross-sectional view of an alternative embodiment of an integrated circuit chip 1200 manufactured in accordance with the principles of the present invention. The integrated circuit chip 1200 illustrated in FIG. 12 is substantially similar to the integrated circuit chip 100 illustrated in FIG. 1, with the exception of the placement of the first capacitor plate, insulator, and the second capacitor plate. Because the integrated circuit chip 1200 is substantially similar to the integrated circuit chip 100, like reference numbers are used to reference like features.

The embodiment of FIG. 12 uses a polysilicon layer located over the field oxide layer 133 as the first capacitor plate 1210. The embodiment of FIG. 12 further uses the third metal level located between the third interlevel dielectric layer 143 and the fourth interlevel dielectric layer 148 as the second capacitor plate 1230. Accordingly, only the first interlevel dielectric layer 135, the second interlevel dielectric layer 138, and the third interlevel dielectric layer 143 comprise the insulator 1220. This embodiment might be used wherein lower breakdown voltages are required. For example, this embodiment might be used wherein breakdown voltages ranging from about 1000 volts to about 1500 volts are desired.

Although the present invention has been described in detail, those skilled in the art should understand that they can make various changes, substitutions and alterations herein without departing from the spirit and scope of the invention in its broadest form.

What is claimed is:

1. A method of forming an integrated circuit including a transistor and a capacitor, comprising:
    forming a first doped well region in a transistor region and a second doped well region in a capacitor region of a semiconductor substrate using first shared processing steps, the second doped well region defining a first capacitor plate;
    forming a field oxide layer over the second doped well region;
    forming a gate structure for the transistor over the first doped well region;
    forming a first interlevel dielectric layer over the field oxide layer and over the gate structure;
    forming a conductive lead above the first interlevel dielectric layer to provide an electrical connection for the transistor;
    forming a second interlevel dielectric layer over the first interlevel dielectric layer including over the conductive lead;
    forming a protective overcoat layer over the second interlevel dielectric;

forming an opening through the protective overcoat and the second interlevel layer down to the conductive lead, using at least two photomask patterning and etching steps; and forming a second capacitor plate over the protective overcoat layer over the second doped well region, and forming a conductive feature over the protective overcoat layer and within the opening in the transistor region using second shared processing steps.

2. The method of claim 1, wherein the first shared processing steps comprise forming the first and second doped well regions using a shared photoresist mask.

3. The method of claim 2, wherein the first shared processing steps further comprise forming doped n-type well regions having peak dopant concentrations of 1E16 atoms/cm$^3$ to 1E20 atoms/cm$^3$.

4. The method of claim 2, wherein the second shared processing steps comprise forming the second capacitor electrode and the conductive feature using a layer of copper.

5. The method of claim 4, wherein the second shared processing steps further comprise forming the layer of copper over the protective overcoat including within the opening; and patterning the layer of copper, resulting in the second capacitor electrode and the conductive feature.

6. The method of claim 4, wherein forming the second capacitor plate comprises forming a plurality of second capacitor plates over the second doped well region.

7. The method of claim 4, further comprising forming capacitance uniformity structure within at least one of the first or second interlevel dielectric layer.

8. The method of claim 7, wherein forming the capacitance uniformity structure comprises forming one or more floating metal rings between the first and second interlevel dielectric layers.

9. The method of claim 7, wherein forming the capacitance uniformity structure comprises forming one of more floating metal rings surrounding and located outside of a footprint of the second capacitor plate.

10. The method of claim 1, wherein the second shared processing steps further comprise forming the layer of copper over the protective overcoat including within the opening; and patterning the layer of copper, resulting in the second capacitor electrode and the conductive feature.

11. The method of claim 1, further comprising forming capacitance uniformity structure within at least one of the first or second interlevel dielectric layer.

12. The method of claim 11, wherein forming the capacitance uniformity structure comprises forming one or more floating metal rings between the first and second interlevel dielectric layers.

13. The method of claim 11, wherein forming the capacitance uniformity structure comprises forming one of more floating metal rings surrounding and located outside of a footprint of the second capacitor plate.

14. A method of forming an integrated circuit including a transistor and a capacitor, comprising:

forming a first doped well region in a transistor region and a second doped well region in a capacitor region of a semiconductor substrate, the second doped well region defining a first capacitor plate;

forming a gate structure for the transistor over the first doped well region;

forming at least one interlevel dielectric layer over the gate structure in the transistor region and over the capacitor region;

forming a floating metal ring within the at least one interlevel dielectric layer;

forming a second capacitor plate over the at least one interlevel dielectric layer in the capacitor region, the second capacitor plate having a footprint located within the floating metal ring.

* * * * *